United States Patent
Ohlsson et al.

(10) Patent No.: US 8,138,493 B2
(45) Date of Patent: Mar. 20, 2012

(54) OPTOELECTRONIC SEMICONDUCTOR DEVICE

(75) Inventors: Jonas Ohlsson, Malmö (SE); Lars Samuelson, Malmö (SE)

(73) Assignee: QuNano AB, Lund (SE)

( * ) Notice: Subject to any disclaimer, the term of this patent is extended or adjusted under 35 U.S.C. 154(b) by 236 days.

(21) Appl. No.: 12/499,491

(22) Filed: Jul. 8, 2009

(65) Prior Publication Data

US 2010/0006817 A1    Jan. 14, 2010

Related U.S. Application Data

(63) Continuation of application No. PCT/SE2009/050858, filed on Jul. 2, 2009.

(30) Foreign Application Priority Data

Jul. 9, 2008 (SE) ........................................ 0801649

(51) Int. Cl.
*H01L 33/00* (2010.01)

(52) U.S. Cl. ......... 257/13; 257/94; 257/98; 257/E29.07; 257/E29.071

(58) Field of Classification Search ................. None
See application file for complete search history.

(56) References Cited

U.S. PATENT DOCUMENTS

| | | |
|---|---|---|
| 7,335,908 B2 | 2/2008 | Samuelson et al. |
| 2006/0021647 A1* | 2/2006 | Gui et al. ................ 136/252 |
| 2008/0036038 A1* | 2/2008 | Hersee et al. ............ 257/615 |
| 2010/0019252 A1 | 1/2010 | Bratkovski et al. |

* cited by examiner

*Primary Examiner* — Minh-Loan T Tran
*Assistant Examiner* — Leslie Pilar Cruz
(74) *Attorney, Agent, or Firm* — The Marbury Law Group, PLLC

(57) ABSTRACT

The present invention provides an optoelectronic semiconductor device comprising at least one semiconductor nanowire, wherein the nanowire comprises a nanowire core and at least one shell layer arranged around at least a portion of the nanowire core. The nanowire core and the shell layer form a pn or pin junction that in operation provides an active region for carrier generation or carrier recombination. Quantum dots adapted to act as carrier recombination centres or carrier generation centres are arranged in the active region. By using the nanowire core as template for formation of the quantum dots and the shell layer, quantum dots of homogeneous size and uniform distribution can be obtained. Basically, the optoelectronic semiconductor device can be used for light generation or light absorption. In the former case the optoelectronic semiconductor device is a light emitting diode or a laser diode and in the latter case the optoelectronic semiconductor device is a photoelectric device, such as a photo diode, a photo detector or a solar cell.

20 Claims, 3 Drawing Sheets

OPTOELECTRONIC SEMICONDUCTOR DEVICE

CROSS-REFERENCE TO RELATED APPLICATIONS

This application is a Continuation of PCT/SE2009/050858, filed Jul. 2, 2009, which claims priority from Swedish patent application SE 0801649-5, filed Jul. 9, 2008. The entire contents of each of the aforementioned applications are incorporated herein by reference.

TECHNICAL FIELD OF THE INVENTION

The present invention relates to the use of self assembled quantum dots, and in particular Stranski Krastanow dots, in optoelectronic semiconductor devices such as light emitting diodes and photoelectric devices.

BACKGROUND OF THE INVENTION

Self assembled quantum dots, or Stranski Krastanow dots, hereinafter interchangeably referred to as SK dots or simply quantum dots, are used as efficient one dimensional quantum wells in semiconductor devices. Such quantum dots have been realized in a multitude of semiconductor material systems, such as InAs/GaAs, InAs/InP, InP/GaAs, InGaN/GaN, InN/GaN, GaN/AlGaN etc., either on planar surfaces or grown along edges.

Semiconductor quantum dots can be formed during epitaxial growth of a semiconductor layer on a substrate that is lattice mismatched to the semiconductor layer. In this growth process the dot formation is encouraged by minimizing the energy associated with crystal strain. The size of the dots formed is determined by fundamental parameters such as the surface energy of the dot facets and the interface between the dot and the substrate together with the accommodated crystal strain. In most applications a homogeneous size distribution is important, since slight variation in size will alter the relative position of the energy states of valence and conduction band. In several growth techniques the size of the dots can be varied within a limited range while retaining a fairly homogeneous size distribution by controlling growth conditions. However, for many applications the dot sizes vary too much.

The effect of quantum dots may be utilized in e.g. light emitting diodes (LED), transistors, solar cells, etc. For example, the quantum dots can be used to adjust the colour of the light emitted from a LED device. In general, larger quantum dots yield a redder light (longer wavelength) and smaller quantum dots yield a bluer light (shorter wavelength). Lightly strained quantum dots yield a redder light and more highly strained quantum dots yield a bluer light. Consequently it is a challenge to obtain a certain wavelength of the emitted light if there is a large lattice mismatch giving high strain levels. Furthermore, the wavelength can be altered by changes in the composition of the dots. Thus, the effect of the quantum dots relies on dot size, dot composition and strain.

In particular, growth of III-Nitride (III-N) semiconductor quantum dots in nitride based III-V materials, such as GaN, which are of special interest for LED applications, while retaining a sufficiently homogeneous size distribution has been shown to be hard to achieve. Investigations utilizing different carrier gas mixtures in order to manipulate column three material diffusion lengths and desorption conditions have shown to be insufficient for the fabrication of homogenously sized quantum dots. This indicates that it is the substrate surface quality that causes variation in local growth conditions for the quantum dots. This can for example be due to the high defect density and surface roughness of the low quality substrate, which prevent homogeneous kinetic conditions for the source materials on the substrate surface. Such local variations will not only degrade the size homogeneity but also the homogeneity of composition of ternary and quaternary quantum dots and owing to the variations in size and composition of individual dots the strain conditions of individual dots will vary.

Nitride based III-V materials, such as GaN, which are of special interest for LED applications have a high defect density due to the lack of compatible substrates. For GaN based devices SiC, $Al_2O_3$, and Si are most commonly used. These materials are lattice mismatched with respect to GaN, which causes a high defect density in the GaN. Also, they suffer from a high thermal expansion mismatch with respect to GaN. Moreover, SiC and $Al_2O_3$ are expensive and not yet commercially available in large wafer sizes.

SUMMARY OF THE INVENTION

In view of the foregoing one object of the present invention is to provide homogenously sized dots with a uniform spatial distribution in a semiconductor material. This object of the present invention is achieved by an optoelectronic semiconductor device in accordance with the attached claims.

The optoelectronic semiconductor device comprises at least one semiconductor nanowire, which comprises at least a nanowire core and a shell layer arranged around at least a portion of the nanowire core. Preferably the nanowire protrudes from a substrate. The nanowire core and the shell layer forms a pn or pin junction that in operation provides an active region for carrier generation or carrier recombination. Quantum dots are arranged in a region of the nanowire corresponding to the active region in order to act as carrier recombination centres or carrier generation centres. By using the nanowire core as template for formation of the quantum dots and the shell layer, quantum dots of homogeneous size and uniform distribution can be obtained.

According to a first aspect of the invention the optoelectronic semiconductor device is a light emitting diode (LED), wherein the active region comprises quantum dots adapted to act as carrier recombination centres for generation of light. Preferably the nanowire of the LED comprises nitride based III-V semiconductor materials.

According to a second aspect of the invention the optoelectronic device is a photoelectric device, wherein the active region comprises quantum dots adapted to act as carrier generation centres by light absorption.

The quantum dots may be embedded in the nanowire core and/or an intermediate shell layer and/or the shell layer. Further a plurality of concentric layers of quantum dots is possible, optionally with different sizes and/or compositions in the different layers.

Said nitride base III-V semiconductor materials preferably comprise Ga, In, Al and/or B. The nanowire core, the quantum dots, the shell layer and the intermediate shell layer are more preferably made of any, or a combination of, $Al_xIn_zGa_{1-x-z}N$, $Al_xGa_{1-x}N$, $In_xGa_{1-x}N$ or GaN. Non nitride semiconductor materials preferably comprise comprises any, or a combination of, III-V, IV or II-VI semiconductor materials.

Thanks to the invention it is possible to provide a LED device emitting light at one or more well-defined wavelengths with high efficiency. For example a LED device comprising concentric layers comprising quantum dots that each emits light at different wavelength, i.e. different colours, can be provided.

It is a further advantage of the invention that it makes it possible to provide LED devices fabricated in materials of the GaN system that can emit light with high efficiency in the infra-red to green wavelength region.

The present invention also makes it possible to provide LED devices that can generate light with a narrow spectral distribution. This can be used for laser applications and other applications that need sharp wavelength peaks of the emitted light.

Thanks to the invention according to the second aspect it is also possible to provide photo diodes and photo detectors that absorb light at one or more well-defined wavelengths with high efficiency.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION OF EMBODIMENTS

Nanowires are usually interpreted as nanostructures that are of nanometer dimension in its diameter. As the term nanowire implies, it is the lateral size that is on the nanoscale whereas the longitudinal size is unconstrained. Such nanostructures are commonly also referred to as nanowhiskers, one-dimensional nanoelements, nanorods, etc. Although these terms imply an elongated shape the nanowires may be pyramidal or stub-like and since nanowires may have various cross-sectional shapes the diameter is in this application intended to refer to the effective diameter. Generally, nanowires are considered to have at least two dimensions each of which are not greater than 300 nm, but nanowires can have a diameter or width of up to about 1 μm. The one dimensional nature of the nanowires provides unique physical, optical and electronic properties. These properties can for example be used to form devices utilizing quantum mechanical effects or to form heterostructures of compositionally different materials that usually cannot be combined due to large lattice mismatch. One example is integration of semiconductor materials with reduced lattice-matching constraints, which for example allow the growth of III-V semiconductor nanowires on Si substrates.

Further, nanowires provide surfaces with low defect densities as templates for further epitaxial growth, which is a requirement for making quantum dots of homogeneous size and uniform distribution.

Figure 1:
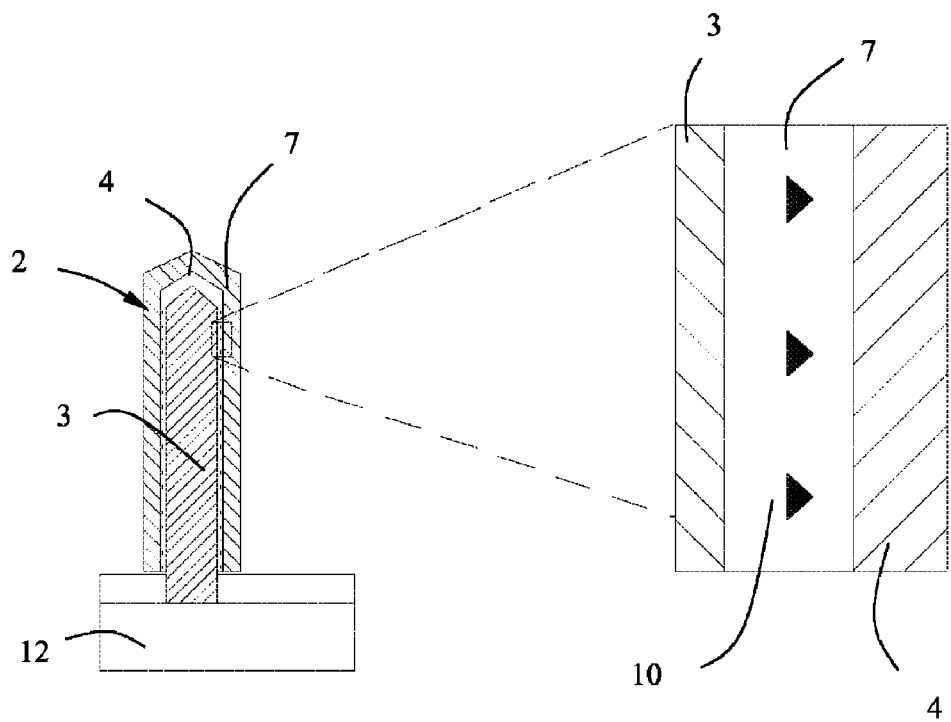
FIG. 1 is a schematic cross sectional view of an optoelectronic semiconductor device comprising quantum dots according to the invention.

Referring to FIG. 1, an optoelectronic semiconductor device according to the invention comprises at least one semiconductor nanowire 2, which comprises at least a nanowire core 3 and at least a shell layer 4 arranged around at least a portion of the nanowire core 3. Preferably the nanowire 2 protrudes from a substrate 12. The nanowire core 3 and the shell layer 4 forms a pn or pin junction that in operation provides an active region 7, i.e. the active region at least partly forms a depletion region between p and n regions of the pn or pin junction, for carrier generation or carrier recombination. Quantum dots 10 are arranged at least in a region of the nanowire corresponding to the active region 7 in order to act as carrier recombination centres or carrier recombination centres. By using the nanowire core 3 as template for further formation of the quantum dots 10 and the shell layer 4, quantum dots 10 of homogeneous size and uniform distribution can be obtained.

Basically, the optoelectronic semiconductor device can be used for light generation or light absorption. In the former case the optoelectronic semiconductor device is a light emitting diode, wherein the quantum dots 10 in the active region 7 in operation act as carrier recombination centres. In the latter case the optoelectronic semiconductor device is a photoelectric device, such as a photo diode, a photo detector or a solar cell, wherein the quantum dots 10 in the active region 7 in operation act as carrier generation centres. In the following the optoelectronic semiconductor device is described mostly in terms of an LED device. Although the purposes of a light emitting diode and a photoelectric device are different it is appreciated by a person skilled in the art that the object of the different embodiments applies to photoelectric devices as well. However, due to the different purposes the embodiments may have to be adapted thereto.

One embodiment of the present invention is a nanostructured LED device comprising a nanowire 2 protruding from a substrate 12. The nanowire 2 comprises a shell layer 4 arranged around a nanowire core 3 forming a radial pn-junction contributing to the formation of an active region 7 at the interface between the shell layer 4 and the nanowire core 3 to produce light. Preferably the nanowire 2 is made of nitride based III-V semiconductor materials, however the nanowire can also be made of non-nitride materials. The active region 7 comprises quantum dots 10 adapted to act as recombination centres. Preferably the quantum dots are uniformly distributed and having homogenous size. In one embodiment the nanowire core 3 is an n-doped nitride based III-V semiconductor and the shell layer 4 is a p-doped nitride based III-V semiconductor.

Figure 2:
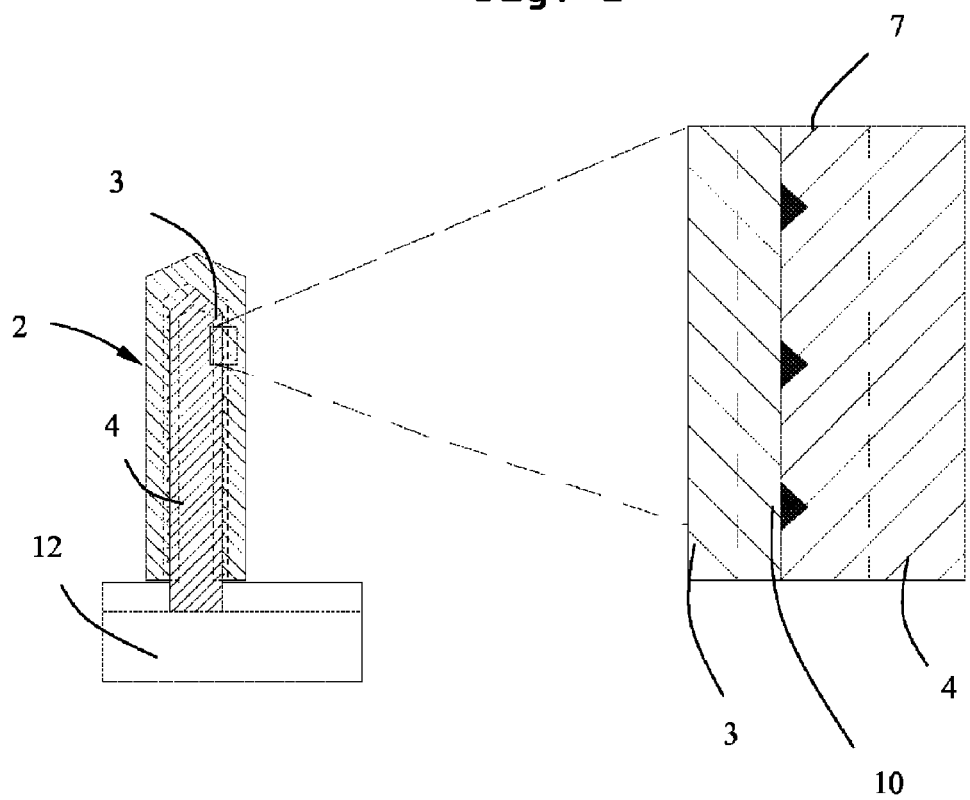
FIG. 2 schematically illustrates quantum dots arranged on the circumferential surface of the nanowire core.

FIG. 2 schematically illustrates one embodiment of a nanostructured LED device comprising a nanowire 2 of a III-N semiconductor material protruding from a semiconductor substrate 12. The nanowire 2 comprises a nanowire core 3 enclosed in a shell layer 4 forming a pn-junction that in operation provides an active region 7 to produce light. Quantum dots 10 are in epitaxial connection to the circumferential surface of the nanowire core 3 and embedded in the shell layer 4. The nanowire design is hereby adapted to make the quantum dots 10 function as recombination centres in the active region 7. Thereby the wavelength of the generated light is essentially controlled by the size and spatial distribution of the quantum dots 10. Preferably the quantum dots 10 are of homogenous size and uniformly distributed to give a predetermined wavelength of the produced light, which is to be emitted from the nanostructured LED device. The circumferential surface may comprise facets and/or edges which are suitable for quantum dot growth.

Figure 3:
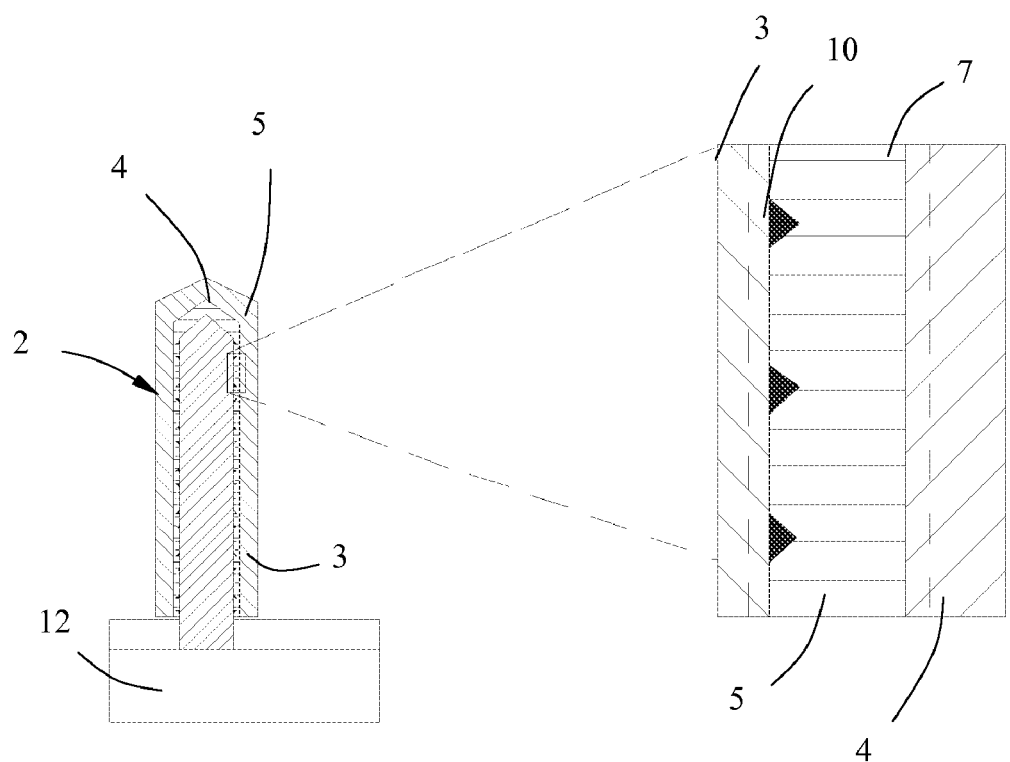
FIG. 3 schematically illustrates quantum dots embedded in an intermediate shell layer according to the invention.

FIG. 3 illustrates another embodiment of a nanostructured LED device comprising a nanowire 2 having a nanowire core 3 and a shell layer 4. Quantum dots 10 are embedded in an intermediate shell layer 5 which is enclosed between the nanowire core 3 and the shell layer 4. In operation the active region 7 (only shown in the enlarged view) is adapted to extend over the quantum dots 10. By way of example the nanostructured LED device may comprise an n-GaN nanowire core 3, an intermediate shell layer 5 of $In_xGa_{1-x}N$ comprising embedded InGaN SK dots and a shell layer 4 of p-GaN. Preferably the SK dots are uniformly distributed and of homogenous size, or have a pre-determined size distribution to provide light emission within a certain wavelength interval or at certain pre-determined wavelengths.

As mentioned above nanowires provide surfaces with low defect densities, in principle defect-free surfaces, which can function as templates for further epitaxial growth. Accordingly the spatial distribution and size of the quantum dots 10 of the present invention is preferably uniform over a circumferential surface of the nanowire 2. This is achieved by providing equal growth conditions over the whole surface. However, the growth conditions may be altered to accomplish any other pre-determined distribution along and around the nanowire 2. Moreover, the circumferential surface may comprises both facets and planar sub-surfaces and edges that are defined by the crystal structure of the nanowire material. The quantum dots can be grown selectively on these facets or edges.

Figures 4, 5:
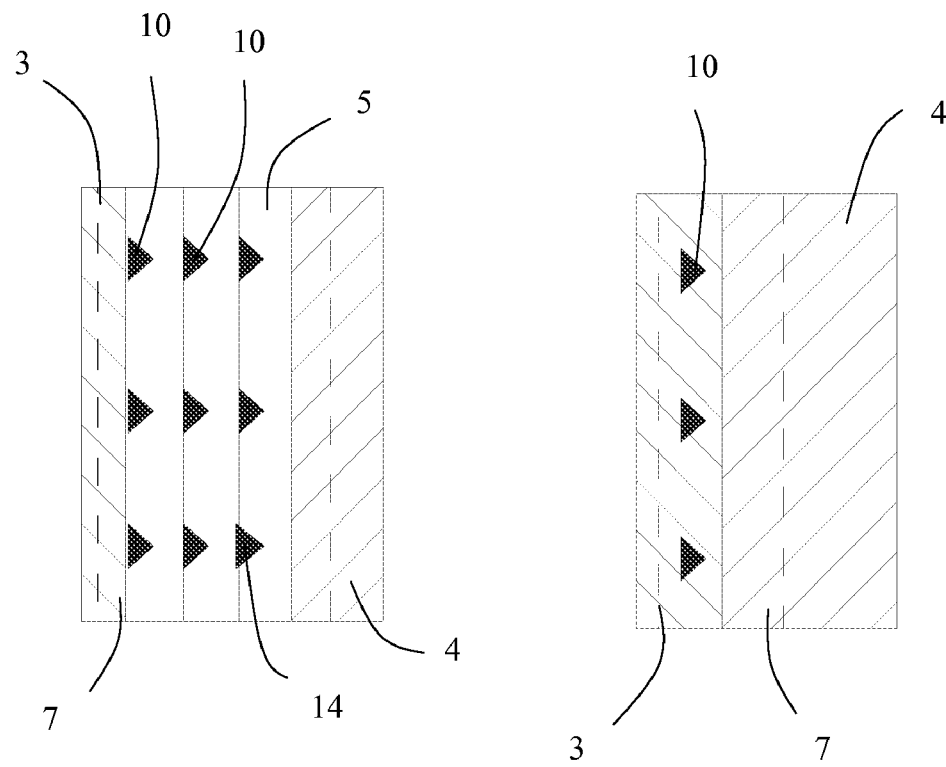
FIG. 4 is a cross sectional view of a portion of a nanowire comprising multiple concentric layers of quantum dots.
FIG. 5 is a schematic cross sectional view of a portion of a nanowire comprising quantum dots embedded in the nanowire core.

Referring to FIG. 4, in one embodiment of the present invention of a nanostructured LED device according to the present invention the quantum dots 10 have a radial distribution. The quantum dots 10 are arranged in a plurality of concentric layers, e.g. within an intermediate shell layer 5, around the nanowire core 3. Such concentric layers can be accomplished by an alternating growth process: providing a first circumferential surface for quantum dot growth; growing quantum dots on the first circumferential surface; growing a first semiconductor layer enclosing the quantum dots 10, the first semiconductor layer providing a second circumferential surface for quantum dot growth; growing quantum dots on the second circumferential surface; growing a second semiconductor layer enclosing the quantum dots 10; and growing a shell layer 4 to enclose the second semiconductor layer. The first and second semiconductor layers make up the intermediate shell layer 5 and obviously the number of semiconductor layers, i.e. the number of concentric layer of quantum dots 10, is not limited to two layers. The alternating growth process can be iterated to obtain a pre-determined number of concentric layers, e.g. 3, 4, 5, etc. The active region of the LED device may extend over all quantum dot containing concentric layers or one or more concentric layers may each from an active region. Hence a LED device comprising concentric layers comprising quantum dots that each emits light at different wavelength, i.e. different colours, can be provided.

In another embodiment of the present invention the nanostructured LED device comprises a nanowire core 3 enclosed by a shell layer 4 forming a pn-junction adapted to form an active region 7 to generate light. A plurality of concentric layers of quantum dots 10 are embedded in the shell layer 4 adjacent to the nanowire core 3 in order to be comprised in the active region 7 when the LED is activated.

FIG. 5 schematically illustrates one embodiment of a nanostructured LED device in accordance with the present invention comprising a nanowire core 3 enclosed by a shell layer 4 forming a pn-junction adapted to form an active region 7 to generate light. Quantum dots 10 are embedded in the nanowire core 3 adjacent to the shell layer 4 in order to be comprised in the active region 7 when the LED is activated.

Although the embodiments described above show quantum dots embedded in either the nanowire core 3, the intermediate shell layer 5 or the shell layer 4 part it should be understood that quantum dots 10 can be arranged in more than one part in a single device. Referring to FIG. 6, by way of example one embodiment of the present invention comprises a first concentric layer of quantum dots 10 grown on the circumferential surface of a nanowire core 3 and embedded in an intermediate shell layer 5. A second concentric layer of quantum dots 10 is grown on the circumferential surface of the intermediate shell layer 5 and embedded in a shell layer 4.

The size of the quantum dots 10 of a nanostructured LED device of the present invention can be altered from one concentric layer of quantum dots to another. This can for example be used to obtain light emission at a plurality of well defined wavelengths, e.g. RGB for white light output, or within a certain wavelength interval. In addition the size of the quantum dots 10 of different concentric layers can be different e.g. to adjust the wavelength of the emitted light of the nanostructured LED.

In one embodiment of the present invention the nanostructured LED device comprises a nanowire 2 protruding from a substrate 12. In accordance with the present invention a shell layer 4 is arranged around a nanowire core 3 forming a radial pn-junction that can contribute to the formation of an active region 7 at the interface between the shell layer 4 and the nanowire core 3 in order to produce light. The active region 7 comprises one or more concentric layer of quantum dots 10 adapted to act as carrier recombination centres or carrier generation centres and one or more concentric layer forming a quantum well. Preferably the concentric layers of quantum dots and the concentric layers forming quantum wells are interchangeably stacked onto each other. Such an configuration of the active region 7 may provide efficient light generation in certain wavelength regions such as a for the generation of blue light.

A nanostructured LED device according to the present invention typically comprises an array of nanowires 2 protruding from a substrate to provide a useful light emission from the device.

The substrate may comprise a buffer layer adjacent to the nanowires. The buffer layer may for example serve as a template for nanowire growth and can also be used to electrically connect the nanowire to a contact.

It has been shown that the small footprint of nanowires gives them the ability to accommodate crystal discrepancies by relaxing to optimal crystal size in all three dimensions. U.S. Pat. No. 7,335,908 discloses the opportunity to use this to grow heavily lattice mismatched sequences in the axial direction of a nanowire. Furthermore, we have noted that the defect density of e.g. GaN nanowires seem to be much smaller than the defect density of the GaN bulk material they are grown on. Especially selectively grown GaN nanowires form crystalline structures with virtually no signs of threading dislocations or stacking faults. Threading dislocations may occur in the nanowires 2 of the nanostructured LED device of the present invention, however the threading dislocation density is preferably less than 3 per nanowire 2 or preferably less than 5% of the nanowires 2 in a population on a substrate 12 comprises a threading dislocation. In comparison, GaN bulk layers grown from substrates of e.g. $Al_2O_3$, Si or SiC generally show very high defect levels with threading dislocation densities of $10^7$-$10^{11}$ cm$^{-2}$. In this sense the nitride based III-V semiconductor nanostructures according to the present invention can be considered to be fundamentally better templates/substrates for continued crystal growth than common bulk nitride based substrates. By using III-N nanowires as templates for SK-dot growth a major cause for variation of local growth conditions due to defects and surface roughness distribution can be eliminated. This enables improved dot homogeneity concerning size, strain and compositional distribution and further also giving the possibility to better alter dot size by variation of growth conditions while retaining homogeneous dots.

By way of example, the III-V system $Al_xIn_zGa_{1-x-z}N$, incorporating N at the column V element position is theoretically an excellent candidate for the application of SK dots. The strain inducing relative lattice mismatch can be as high as 12% and 14% between the extreme points InN and AlN while the band gap energy varies from 0.8 eV (InN) to 6 eV (AlN), which makes it a challenge to make use of $Al_xIn_zGa_{1-x-z}N$ in a device designed and manufactured according to conventional planar technology. However, an optoelectronic semiconductor device according to one embodiment of the present invention comprises a nanowire 2 having a nanowire core 3 made of GaN and a shell layer 4 made of AlGaN. Quantum dots 10 made of GaN are embedded in the shell layer adjacent to the nanowire core 3. SK dots incorporating Al are of interest for UV (ultra violet) applications above the fundamental bandgap of GaN (3.3 eV), but can also be used in higher bandgap applications. One example of such an application is in water purification using UV-light.

It is difficult to fabricate light emitting diodes in the infrared to green wavelength region using conventional planar technology in the GaN system and these give much lower efficiency than blue colour emitting LEDs. This can be attributed to that: a) a miscibility gap for an InGaN material in the red and green wavelength region since $In_xGa_{1-x}N$ with approximately $0.4<x<0.8$ is not theoretically expected to be a stable material; and b) the high inherent defect density of the planar layers of the LED structure reduces photonic recombination efficiency by a much higher degree for high In content InGaN than low In content InGaN that is used in blue LEDs. Thanks to the invention it is possible to provide a nanostructured LED device comprising $In_xGa_{1-x}N$ quantum dots 10 that provides light emission in the infra-red to green wavelength region with improved emission. By way of example one such nanostructured LED device comprises a nanowire core made of GaN and InGaN dots embedded in GaN.

A nanostructured LED device of the present invention preferably comprises nitride based III-V semiconductors comprising any or a combination of Ga, In, Al or B. More preferably the nanowire core 2, the quantum dots 10, the shell layer 4 and the intermediate shell layer 5 is preferably comprising any, or a combination of, AlInGaN, AlGaN, InGaN, InN, AlN or GaN.

In one embodiment of the present invention the nanostructured LED device comprises a n-AlGaN nanowire core 3 enclosed in an intermediate shell layer 5 of AlGaN comprising embedded GaN SK dots 10 and a shell layer 4 of AlGaN. This embodiment is suitable for making LEDs emitting UV to blue light.

In one embodiment of the present invention the nanostructured LED device comprises an n-GaN nanowire core 3 enclosed in an intermediate shell layer 5 of $In_xGa_{1-x}N$ comprising embedded $In_yGa_{1-y}N$ SK dots 10 and a shell layer 4 of p-GaN. A dielectric layer, for example made of silicon nitride, can be used as a growth mask.

Figure 6A:
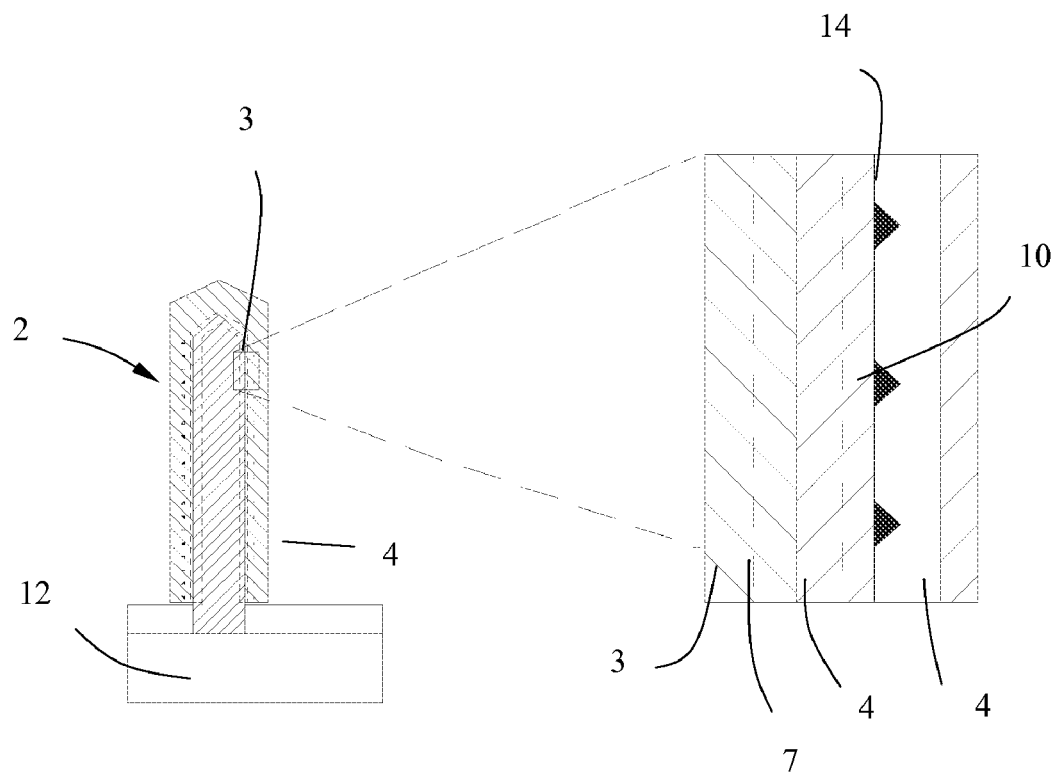
FIGS. 6a-b schematically illustrates embodiments of the present invention comprising quantum dots adapted to absorb and reemit light produced in an active region.
Figure 6B:
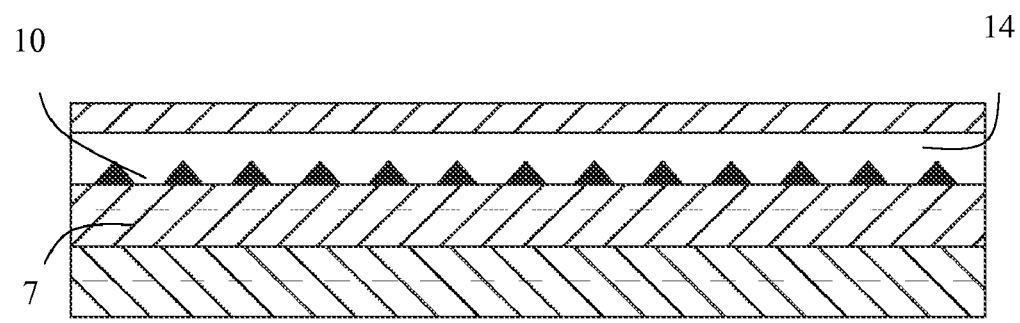

Referring to FIGS. 6a-b, a LED device according to one embodiment of the present invention is made using materials from the GaN system and is adapted to emit blue light from an active region 7. The active region 7 may be without quantum dots. The LED device according to this embodiment further comprises an absorption layer 14 that comprises SK dots 10, preferably homogenously distributed and of uniform size. The SK dots are adapted to absorb and reemit light in colours defined by the quantum well energies of the quantum dots. In prior art phosphors are used to accomplish this absorption. The absorption layer 14 can be provided in nanowire based LEDs according to the present invention or LEDs fabricated using planar technology, as illustrated in FIGS. 6a and 6b, respectively. Optionally a plurality of absorption layers 14 of quantum dots 10 may be arranged in connection to the active region 7. This allows the use of quantum dots 10 with different compositions and/or size to obtain a certain colour distribution of the light to be emitted from the absorption layer 14. To achieve efficient absorption the dot-containing absorption layer 14 should have a lower bandgap than the exciting light and to increase absorption-efficiency it may be advantageous to place it between a reflector and the active region 7 of the LED so that light passes through it twice.

Although the invention has been described for optoelectronic semiconductor devices it should be appreciated that there are electronic devices that benefit from using quantum dots with narrow size distributions according to the invention, exemplified by single-electron transistors and memory cells.

In one embodiment of an optoelectronic semiconductor device according to the invention is a laser diode, wherein a narrow wavelength peak is desired. The nanowire technology makes it possible to provide uniformly sized and distributed quantum dots with controlled composition and strain. Thereby the emitted light can be tailored to be within a narrow wavelength interval and at different wavelengths, with a high efficiency, than is possible with conventional technology.

Although the embodiments of the present invention have been described mainly as being structures made of nitride based semiconductors, the present invention is not limited to nitride based semiconductors. Optoelectronic semiconductor devices comprising quantum dots according to the present invention may comprise non nitride semiconductor materials comprising any, or a combination of, III-V, IV or II-VI semiconductor materials.

According to common nomenclature regarding chemical formula, a compound consisting of an element A and an element B is commonly denoted AB, which should be interpreted as $A_xB_{1-x}$. The compound may be pure A (x=1) or pure B (x=0) or any combination in between.

While the invention has been described in connection with what is presently considered to be the most practical and preferred embodiments, it is to be understood that the invention is not to be limited to the disclosed embodiments, on the contrary, is intended to cover various modifications and equivalent arrangements within the appended claims.

The invention claimed is:

1. An optoelectronic semiconductor device comprising at least one semiconductor nanowire, wherein:
    the nanowire comprises a nanowire core and a shell layer arranged around at least a portion of the nanowire core; and
    the nanowire core and the shell layer form a pn or pin junction that in operation provides an active region for carrier generation or carrier recombination;
    the active region comprises quantum dots adapted to act as carrier recombination centres or carrier generation centres.

2. The optoelectronic semiconductor device according to claim 1, wherein the quantum dots are uniformly distributed along the nanowire and/or around the nanowire.

3. The optoelectronic semiconductor device according to claim 1, wherein the quantum dots are homogenously sized.

4. The optoelectronic semiconductor device according to claim 1, wherein at least a portion of the quantum dots (10) are embedded in the shell layer (4).

5. The optoelectronic semiconductor device according to claim 1, wherein the nanowire (2) comprises an intermediate shell layer (5) between the nanowire core (3) and the shell layer (4) and at least a portion of the quantum dots (10) are embedded in the intermediate shell layer (5).

6. The optoelectronic semiconductor device according to claim 1, wherein at least a portion of the quantum dots are arranged on a circumferential surface of the nanowire core (3).

7. The optoelectronic semiconductor device according to claim 1, wherein the nanowire comprises any, or a combination of, III-V, IV or II-VI semiconductor materials.

8. The optoelectronic semiconductor device according to claim 1, wherein the optoelectronic device is a photoelectric device, wherein the active region comprises quantum dots adapted to act as carrier generation centres by light absorption.

9. A photo detector comprising the optoelectronic semiconductor device according to claim 8.

10. The optoelectronic semiconductor device according to claim 1, wherein the active region comprises a plurality of concentric layers comprising quantum dots.

11. The optoelectronic device according to claim 10, wherein each concentric layer comprises quantum dots adapted to act as carrier recombination centres for generation of light of a different wavelength.

12. The optoelectronic semiconductor device according to claim 1, wherein the optoelectronic semiconductor device is a light emitting diode, wherein the active region comprises quantum dots adapted to act as carrier recombination centres for generation of light.

13. The optoelectronic semiconductor device according to claim 12, wherein the active region comprises one or more concentric layers comprising quantum dots adapted to act as recombination centres and one or more concentric layers each forming a quantum well.

14. The optoelectronic semiconductor device according to claim 12, wherein the generated light is adapted to have a wavelength between 500 nm and 1500 nm.

15. A laser diode comprising the optoelectronic semiconductor device according to claim 12.

16. The optoelectronic semiconductor device according to claim 1, wherein the nanowire comprises nitride based III-V semiconductor materials.

17. The optoelectronic semiconductor device according to claim 16, wherein the nitride base III-V semiconductor materials comprise Ga and/or In and/or Al and/or B.

18. The optoelectronic semiconductor device according to claim 16, wherein the nanowire core, the quantum dots, the shell layer and/or an intermediate shell layer between the nanowire core and the shell layer are made of any, or a combination of, $Al_xIn_zGa_{1-x-z}N$, $Al_xGa_{1-x}N$, $In_xGa_{1-x}N$ or GaN.

19. The optoelectronic semiconductor device according to claim 16, wherein the nanowire core is made of n-GaN, the quantum dots are made of $In_yGa_{1-y}N$, an intermediate shell layer between the nanowire core and the shell layer is made of $In_xGa_{1-x}N$, and the shell layer is made of p-GaN.

20. The optoelectronic semiconductor device according to claim 16, wherein the nanowire core is made of n-GaN, the quantum dots are made of GaN, the intermediate shell layer is made of $Al_xGa_{1-x}N$, and the shell layer is made of p-AlGaN.

* * * * *